United States Patent [19]
Lin

[11] Patent Number: 5,929,525
[45] Date of Patent: Jul. 27, 1999

[54] PROCESS FOR CREATING VIAS USING PILLAR TECHNOLOGY

[75] Inventor: Yung-Fa Lin, Hsin-Chu, Taiwan

[73] Assignee: Taiwan Semiconductor Manufacturing Company, Ltd., Hsin-Chu, Taiwan

[21] Appl. No.: 09/110,357

[22] Filed: Jul. 6, 1998

Related U.S. Application Data

[62] Division of application No. 08/663,573, Jun. 13, 1996, Pat. No. 5,801,093.

[51] Int. Cl.$^6$ .............................. H01L 23/48; H01L 21/44
[52] U.S. Cl. .......................... 257/758; 257/762; 257/763; 257/764; 257/760
[58] Field of Search .................................... 257/758, 762, 257/763, 764, 765, 915, 760

[56] References Cited

U.S. PATENT DOCUMENTS

| | | | |
|---|---|---|---|
| 4,917,759 | 4/1990 | Fisher et al. | 156/643 |
| 5,262,354 | 11/1993 | Cote et al. | 437/195 |
| 5,306,952 | 4/1994 | Matsuura et al. | 257/765 |
| 5,312,512 | 5/1994 | Allman et al. | 156/636 |
| 5,616,519 | 4/1997 | Ping | 438/626 |
| 5,639,692 | 6/1997 | Teong | 437/195 |
| 5,654,589 | 8/1997 | Huang et al. | 257/763 |

*Primary Examiner*—Peter Toby Brown
*Assistant Examiner*—Hung Van Duong
*Attorney, Agent, or Firm*—George O. Saile; Stephen B. Ackerman

[57] ABSTRACT

A process for creating metal pillar via structures, used to interconnect multilevel metallizations, has been developed. The process features the creation of a via hole, in a thin dielectric layer, exposing the top surface of an underlying first level metallization structure. The metal pillar via structure is next formed, contacting the first level metallization structure, exposed in the opened via hole in the thin dielectric layer. The spaces between the metal pillar via structures are filled with a composite dielectric material, featuring a spin on glass layer, which provides partial planarazation. The planarazation process is completed via a chemical mechanical polishing process, which also exposes the top surface of the metal pillar via structure, making the metal pillar via structure easily accessible for contact for subsequent, overlying metallization structures.

4 Claims, 5 Drawing Sheets

PROCESS FOR CREATING VIAS USING PILLAR TECHNOLOGY

This application, Ser. No. 09/110,357, is a divisional application of parent application, Ser. No. 08/663,573 filed Jun. 13, 1996 which has been issued as a patent, U.S. Pat. No. 5,801,093, on Sep. 01, 1998.

BACKGROUND OF THE INVENTION

1. Field of the Invention

This invention relates to methods used for the fabrication of semiconductor devices, and more specifically to processes used to create vias between interconnect metallization levels.

2. Description of the Prior Art

The semiconductor industry is continually striving to improve the performance of semiconductor devices, while still attempting to reduce the cost of these same devices. These objectives have been partially achieved by the trend to micro-miniaturazation, or the ability to produce semiconductor devices with sub-micron features. Significant advances in specific semiconductor fabrication disciplines, such as photolithography and reactive ion etching, have allowed micro-miniaturization to occur. More sophisticated exposure cameras, as well as the development of more sensitive photoresist materials, have allowed sub-micron images to be created in photoresist layers. Similar advances in the dry etching discipline has resulted in the sub-micron images, in photoresist, in photoresist, being successfully defined in underlying materials, that are used for the fabrication of semiconductor devices.

The use of sub-micron features, can however, create new concerns, not encountered with devices fabricated with less aggressive groundrules. For example in order to maintain the conductivity requirement for sub-micron metal interconnects, the metal lines have to be thicker than for wider metal interconnect counterparts. In addition, the spaces between metal interconnects also decreases, subsequently resulting in difficulties when conventional passivation processes are used to fill these narrow spaces. Another area of concern is via formation, used to connect two levels of metal interconnects. Narrower via holes, used for sub-micron metallization processes, are more difficult to fill with the via metallization, than wider via counterparts that were previously used. These new problems, encountered when using sub-micron technologies, have been addressed. For example Allman, et al, in U.S. Pat. No. 5,312,512, and Fisher, et al, in U.S. Pat. No. 4,917,759, have described methods for filling narrow spaces between metal interconnects. However this invention will teach a fabrication sequence that allows a more complete solution for creation sub-micron vias, using a metal pillar approach, as well as an optimized process for filling the narrow spaces between the metal pillar vias.

SUMMARY OF THE INVENTION

It is an object of this invention to use a metal pillar, as a via, to connect an underlying metal interconnect level to an overlying metal interconnect level.

It is another object of this invention to use a thin dielectric layer as an etch stop layer for the metal pillar definition.

It is still another object of this invention to fill the narrow spaces between metal pillars with a composite dielectric, with one of the layers being a spin on glass material.

It is still yet another object of this invention to remove the composite dielectric, from the surface of the metal pillar, using chemical mechanical polishing.

In accordance with the present a method is described for forming vias, using a metal pillar, and using spin on glass and chemical mechanical polishing, for planarazation purposes. A first level metallization level is deposited and patterned, including contact to underlying device elements via an opened contact hole. Next a thin dielectric layer is deposited. A via hole is opened in the thin dielectric layer, followed by the deposition of a pillar metallization. The pillar metallization is patterned to form a metal pillar via, using the reverse of the mask previously used to open the via hole. A first plasma silicon oxide insulator is deposited, for purposed of passivating the metal pillar via. A spin on glass is than applied, filling the narrow spaces between pillar vias. After bakeout and curing procedure, applied to remove volatile components from the spin on glass layer, a second plasma silicon oxide insulator is deposited, for purposes of encapsulating the spin on glass layer. Chemical mechanical polishing is next employed, to a point in which the top surface of the metal pillar vias are exposed. A second level metallization is deposited and patterned to create the second level metal structure, connected to the underlying first level metal structure by the metal pillar via.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming metal pillar via structures, and the passivation and planarization processes used with the metal pillar via structures, will now be covered in detail. This invention can be used for metallization interconnects used for fabricating MOSFET devices currently being manufactured in industry. Therefore only the specific areas unique to understanding this invention will be described in detail.

Figure 1:
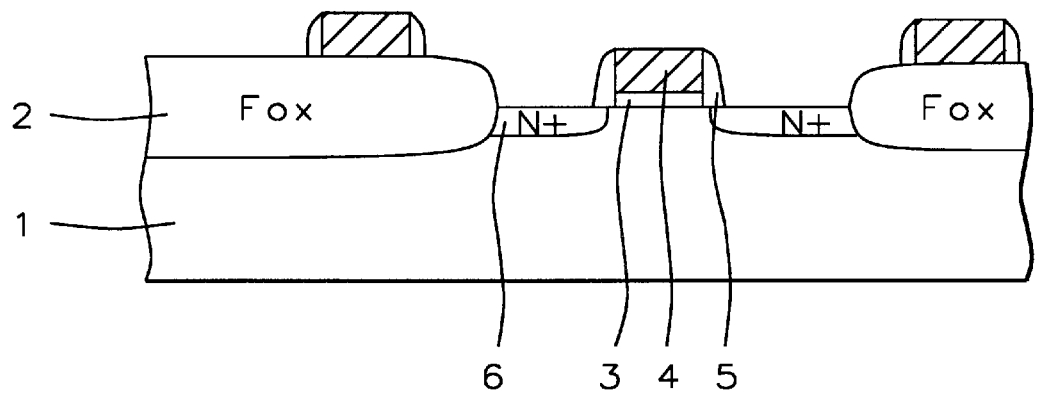
FIG. 1, which schematically, in cross-sectional style, shows a standard metal oxide semiconductor field effect transistor, (MOSFET), device, prior to metal pillar via, and interconnect metallization processing.

A typical N channel, MOSFET device, in which the metal pillar via structure, and accompanying passivation and planarazation processes, will be applied to, is shown in FIG. 1. A P type, single crystalline substrate 1, with a <100> crystallographic orientation is, used. Thick field oxide (FOX), regions, 2, are formed for purposes of isolation. Briefly the process for forming FOX regions is to use an oxidation mask, comprised of an overlying, chemically vapor deposited, silicon nitride layer, and an underlying thermally grown silicon dioxide layer. Conventional photolithographic and reactive ion etching, (RIE), procedures are used to pattern the composite dielectric oxidation mask. After photoresist removal and careful wet cleans, a thermal oxidation is performed at a temperature between about 800° C. to 1000° C., in an oxygen—steam abient, to produce a FOX region between about 4000 to 6000 Angstroms, in unmasked areas. After removal of the composite dielectric oxidation mask, using hot phosphoric acid to remove the silicon nitride layer, and a buffered hydrofluoric acid solution to remove the underlying silicon dioxide layer, a silicon dioxide, gate insulator layer, 3, is thermally grown in an oxygen—steam ambient, at a temperature between about 800 to 1000° C., to a thickness between about 100 to 300 Angstroms. Next a polysilicon layer is deposited using low pressure chemical vapor deposition, (LPCVD), processing, at a temperature between about 600 to 800° C., to a thickness between about 2000 to 4000 Angstroms. The polysilicon layer is next subjected to an ion implantation of phosphorous, at an energy between about 50 to 100 Kev., at a dose between about 5E14 to 1E16 atoms/cm$^2$. Conventional photolithographic and RIE procedures, using $Cl_2$ as an etchant, are used to create the polysilicon gate structure, 4, schematically shown in FIG. 1. After photoresist removal, via plasma oxygen ashing, followed by careful wet cleans, a silicon oxide layer is deposited, using either LPCVD, of plasma enhanced chemical vapor deposition, (PECVD), processing. The silicon oxide layer is grown at a temperature between about 500 to 800° C., to a thickness between about 1000 to 4000 Angstroms, using tetraethylorthosilicate, (TEOS), as a source. A selective, aniostropic, RIE procedure, using $CHF_3$ as an etchant, is used to create insulator sidewall spacer, 5. An ion implantation of arsenic, at an energy between about 50 to 100 Kev., at a dose between about 5E13 to 5E14 atoms/cm$^2$, is used to create source and drain regions, 6, schematically shown in FIG. 1.

Figure 2:
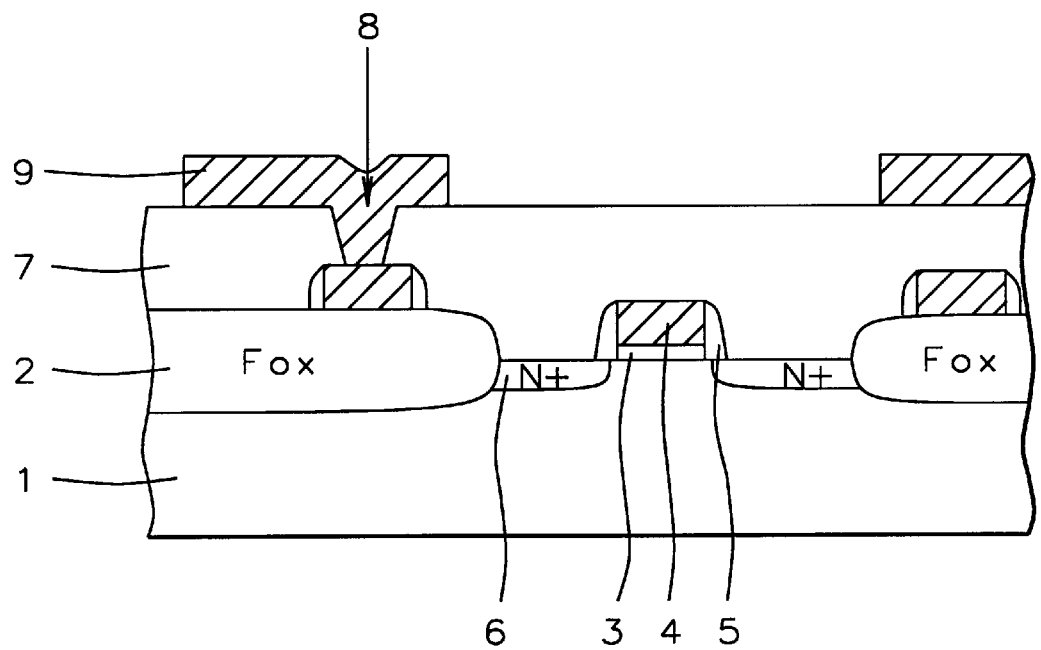
FIG. 2, which schematically, in cross-sectional style, shows the formation of a first level metal interconnect.

The process continues with the deposition of silicon oxide layer, 7, obtained via either LPCVD or PEVCD processing, at a temperature between about 500 to 800° C., to a thickness between about 5000 to 8000 Angstroms. A contact hole, 8, is created in silicon oxide layer, 7, to expose polysilicon gate structure, 4. The contact hole, 8, is formed via conventional photolithographic and RIE procedures, using $CHF_3$ to etch silicon oxide layer, 7. Photoresist removal is accomplished via plasma oxygen ashing, followed by careful wet cleans. A deposition of aluminum, contained between about 1 to 3% copper, and between about 1 to 2% silicon, is performed using r.f. sputtering, to a thickness between about 4000 to 6000 Angstroms. Photolithographic and RIE procedures, using $Cl_2$ for the metal etchant, is performed to create first level metal structure, 9, shown schematically in FIG. 2, after photoresist removal, again accomplished using plasma oxygen ashing and careful wet cleans.

Figure 3:
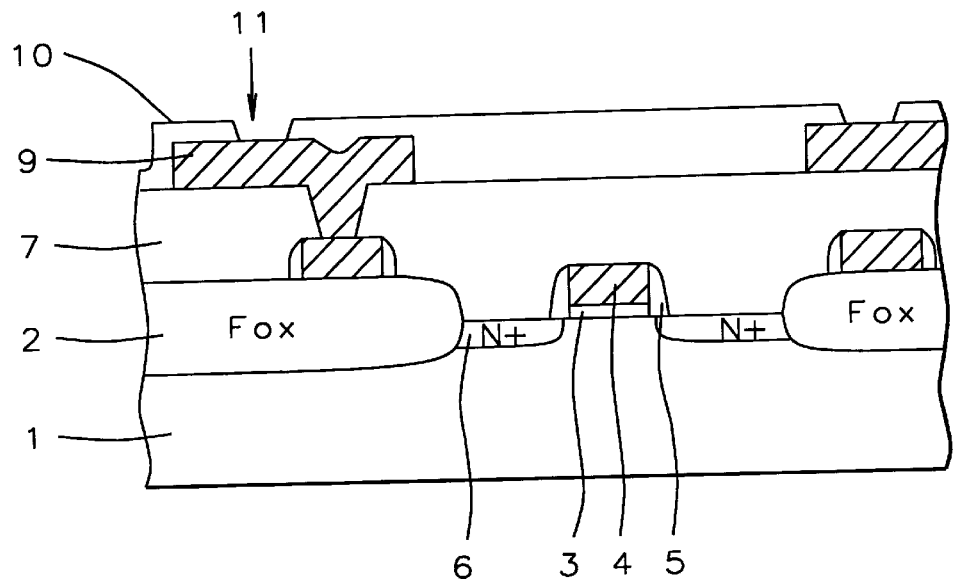
FIG. 3–4, which schematically, in cross-sectional style, shows the formation of the metal pillar via structure.
Figure 4:
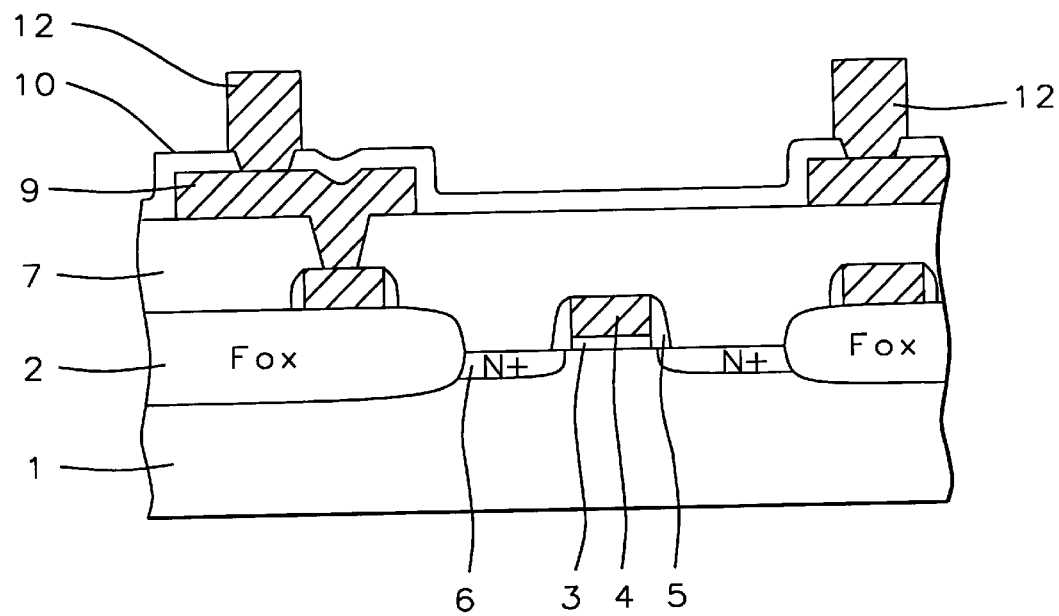

A thin dielectric layer of silicon oxide, 10, to be used as a metal etch stop layer, is deposited using PECVD processing, at a temperature between about 400 to 600° C., to a thickness between about 500 to 1000 Angstroms. A via hole, 11, is next formed in the silicon oxide, metal etch stop layer, 10, using conventional photolithographic and RIE procedures. The RIE etchant used to create via hole, 11, is $CHF_3$. This is shown in FIG. 3, after photoresist removal, using plasma oxygen ashing, following by wet claims. The metallization needed to create the metal pillar via structure is next performed. A deposition of aluminum, containing between about 1 to 3% copper, is made using r.f. sputtering, to a thickness between about 4000 to 6000 Angstroms. Another option is to use LPCVD tungsten for the metal pillar via structure, deposited to a thickness between about 4000 to 6000 Angstroms. If tungsten is desired it is necessary to initially deposit underlying adhesive and barrier layers of titanium, and titanium nitride, via r.f. sputtering, prior to deposition of tungsten. The titanium layer is deposited to a thickness between about 300 to 500 Angstroms, while the titanium nitride layer is deposited to a thickness between about 500 to 1000 Angstroms. Photolithography, using the reverse of the mask previously used to defined via hole, 11, is not used to define the photoresist image used for metal pillar via formation. The creation of metal pillar via structure, 12, is achieved using selective, aniostropic, RIE processing, using $Cl_2$ as an etchant for either the aluminum based metallurgy, or the tungsten based metallurgy. The metal pillar via structure, 12, is shown schematically in FIG. 4, after photoresist removal, using plasma oxygen ashing and careful wet claims. The importance of etch stop, silicon oxide layer, 10, can be seen, allowing the selective $Cl_2$ etching to successfully remove residual metal, without damage first level metal structure, 9.

Figure 5:
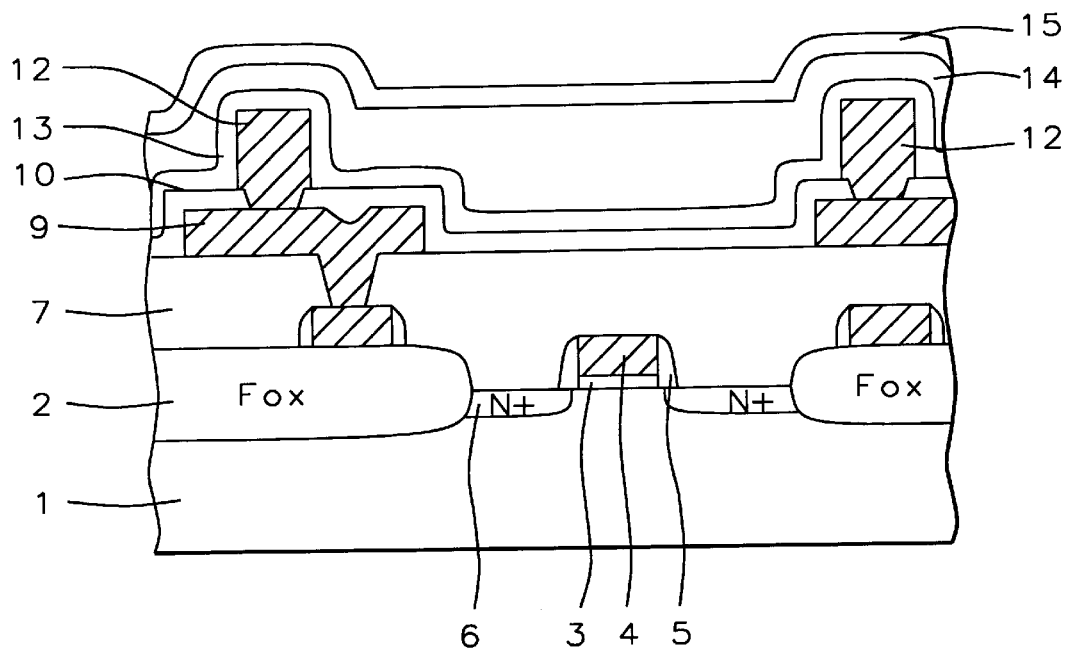
FIGS. 5–6, which schematically, in cross-sectional style, shows the process stages of passivation, and planarazation, used the construction of metal pillar via structures.

A composite dielectric is next deposited, shown in FIG. 5, initiating with a first plasma silicon oxide insulator, 13, obtained using PECVD processing, at a temperature between about 400 to 600° C., to a thickness between about 2000 to 4000 Angstroms. This insulator layer provides passivation for metal pillar via structure, 12, without however filling for spaces between metal pillar via structures. Next a spin on glass, (SOG), material, 14, is applied using siloxane, to a thickness between about 6000 to 10000 Angstroms. This material is used to roughly planarize the existing topography by filling the spaces between metal pillars. The SOG material is subjected to a bake out at a temperature between about 200 to 300° C., using a hot plate, as well as a curing process, performed at a temperature between about 300 to 400° C. These treatments are performed to the SOG material for purposes of removing volatile components, that would otherwise outgas during subsequent temperature excursion, deleteriously influencing surrounding, exposed metal structures. Finally a second plasma silicon oxide insulator, 15, is deposited using PECVD processing, at a temperature between about 400 to 600° C., to a thickness between about 6000 to 10000 Angstroms. The plasma silicon oxide insulator, 15, is used to encapsulate most of the underlying SOG material, 14, offering additional protection in terms of possible SOG outgassing.

Figure 6:
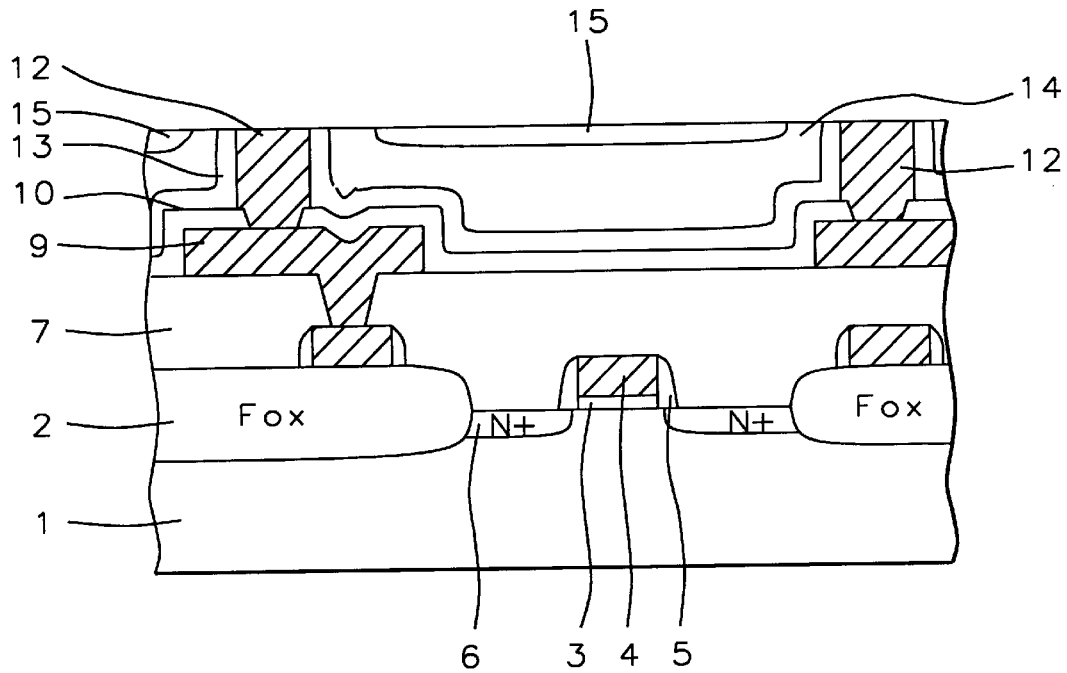
Figure 7:
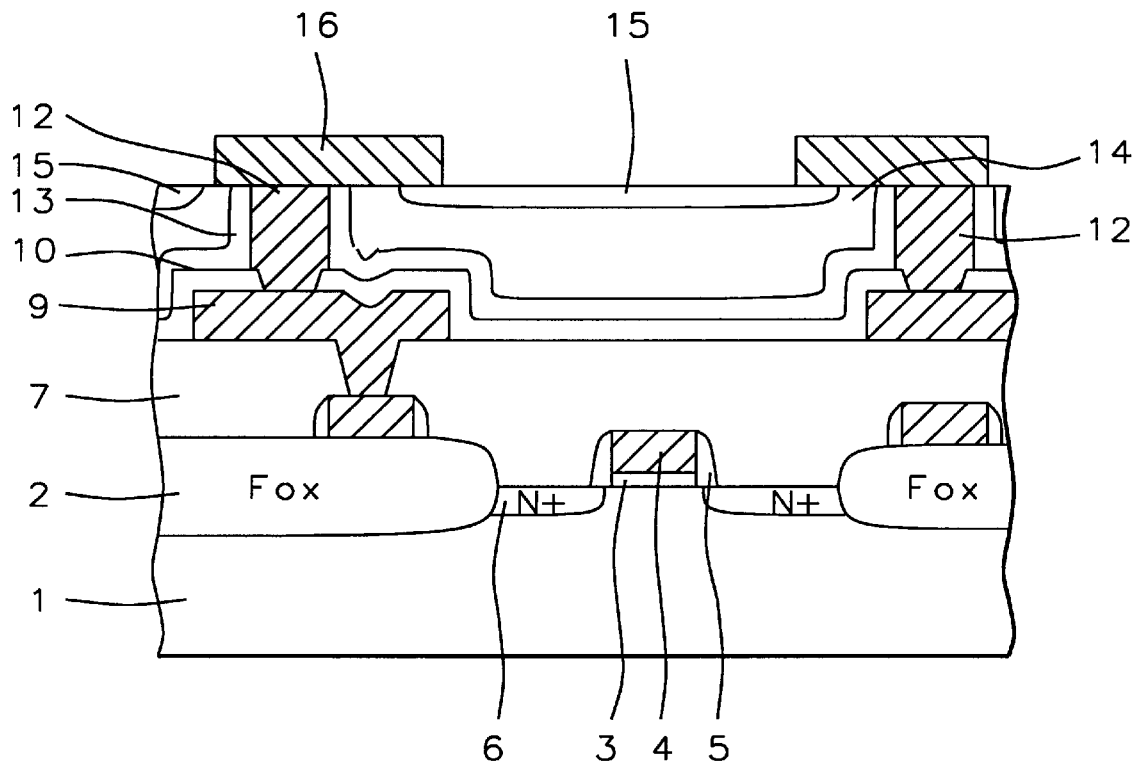
FIG. 7, which schematically, in cross-sectional style, shows the formation of a second level metal interconnect.

FIG. 6, shows the result of a chemical mechanical planarazation, (CMP), step, performed to remove composite dielectric material to a point where the top surface of metal pillar via structures, 12, are exposed. A second level metallization, of aluminum, containing about 1 to 3% copper, is next performed via r.f. sputtering, to a thickness between about 5000 to 1000 Angstroms. Conventional photolithographic and RIE processes, using $Cl_2$ as an etchant, are used to create second level metal structure, 16, shown schematically in FIG. 7. Photoresist removal is once again accomplished using plasma oxygen ashing, following by careful wet cleans.

Figure 8:
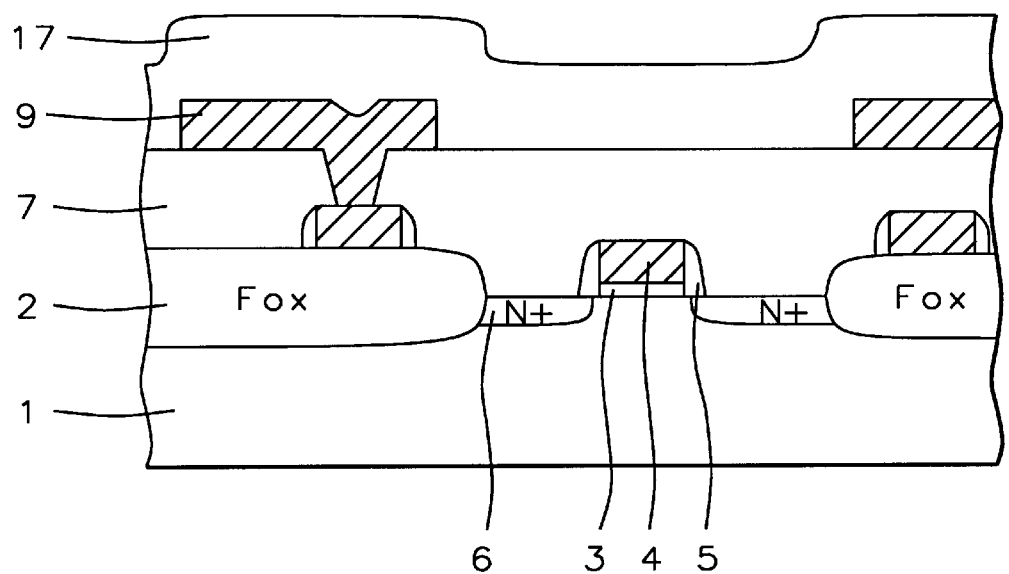
FIGS. 8–9, which schematically, in cross-sectional style, describe a second embodiment, used to planarize a first level metal interconnect and the passivating insulator, prior to the creation of the metal pillar via structures.
Figure 9:
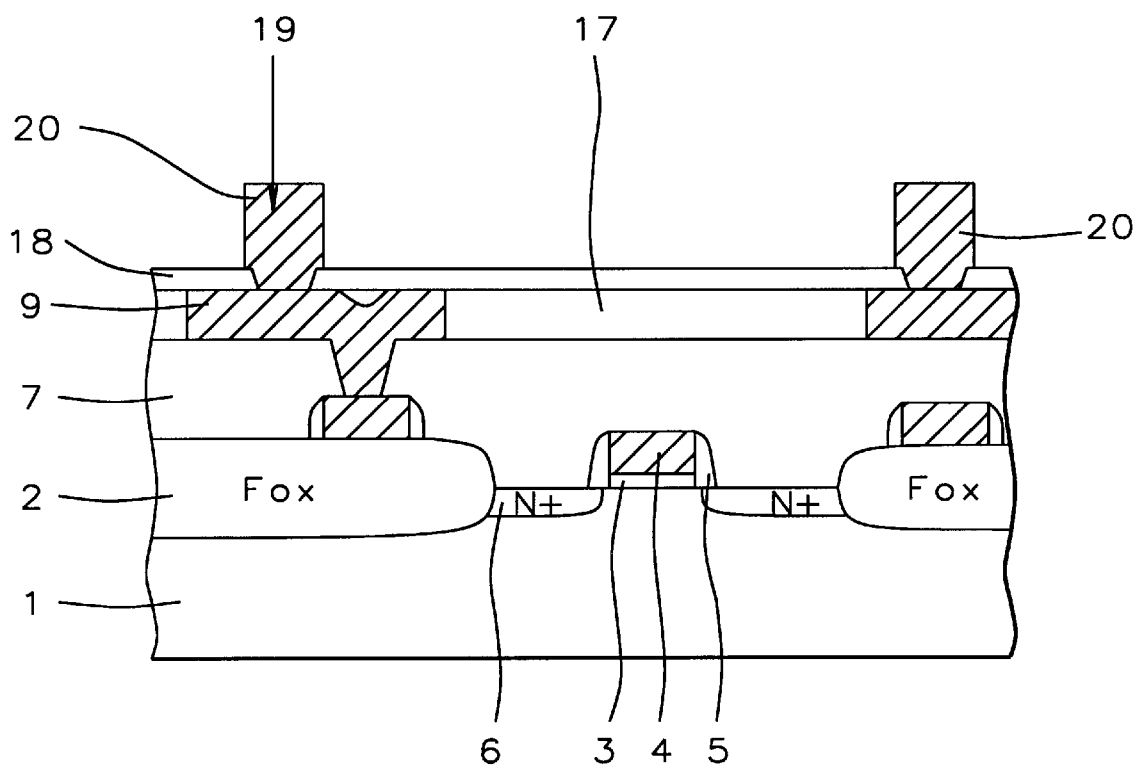

Another iteration can be employed in which a planarazation process is applied to the first level metal structure, 9. This can be accomplished by a deposition of a plasma silicon oxide layer, 17, obtained via PECVD processing, at a temperature between about 400 to 600° C., to a thickness between about 8000 to 12000 Angstroms. This is shown schematically in FIG. 8. A CMP planarazation procedure is next performed, to a point where the surface of first level metal structure 9, is exposed. A thin dielectric layer of silicon oxide, 18, is next deposited on planarized surface, using PECVD processing, at a temperature between about 400 to 600° C., to a thickness between about 500 to 1000 Angstroms. The remaining processes are identical to those previously shown, such as a via hole 19, creation in silicon oxide layer, 18, to expose underlying first level metal structure, 9, and the formation of metal pillar via structures, 20. This is shown schematically in FIG. 9. The deposition of the composite dielectric, planarazation, via CMP, and creation of a second level metal structure, is again identical to structures and processes previously described. However the ability to initially planarize the first level metal structures, reduces the complexity of the second planarazation step, performed prior to second level metallization.

This process for creating vias using metal pillar structures, and SOG for filling the spaces between metal pillar structures, although shown as part of an N channel, (NFET), MOSFET device, can also be used for the fabrication of a P channel, (PFET), MOSFET device, a BiCMOS device, as well as for bipolar devices.

While this invention has been particularly shown and described with reference to, the preferred embodiments thereof, it will be understood by those skilled in the art that various changes in form and details may be made without departing from the spirit and scope of this invention.

What is claimed is:

1. A MOSFET device structure, on a semiconductor substrate, comprising:

field oxide regions on the surface of said semiconductor substrate;

a device region between said field oxide regions;

a first polysilicon gate structure on said semiconductor substrate, in center of said device region;

a second polysilicon gate structure on a first field oxide region;

an insulator sidewall spacer located on sides of the polysilicon gate structures;

source and drain regions in the surface of said semiconductor, between said first polysilicon gate structure in said device region, and said first field oxide region;

a first insulator layer located on said second polysilicon gate structure, on said first polysilicon gate structure, on said source and drain regions, and on portions of said first field oxide region, not covered by said second polysilicon gate structure;

a contact hole in said first insulator layer, exposing a portion of the top surface of said second polysilicon gate structure;

a first level metallization structure, comprised of a first portion, contacting the portion of said second polysilicon gate structure, exposed in said contact hole, and comprised of a second portion, of said first level metallization structure overlying said first insulator layer;

a thin silicon oxide, dielectric layer, between about 500 to 1000 Angstroms in thickness, on said first metallization structure, and on regions of said first insulator layer, not covered by said first level metallization structure;

a via hole in said thin silicon oxide, dielectric layer, exposing a portion of the top surface of said first level metallization structure;

a first portion of said metal pillar via structure contacting the portion of said first level metallization structure, exposed in said via hole, and second portions of said metal pillar via structure, overlying said thin silicon oxide, dielectric layer;

a composite dielectric material, overlying the region of said thin silicon oxide, dielectric layer, not covered by said metal pillar via structure, and with the composite dielectric material filling the spaces between said metal pillar via structures, comprised with a planarized top surface exposing the top surface of said metal pillar via structure; and a second level metallization structure, contacting top surface of said metal pillar via structure, and overlying said composite dielectric material, in spaces between said metal pillar via structures.

2. The MOSFET device structure of claim 1, wherein said metal pillar via structure is fabricated from aluminum, containing between about 1 to 3% copper, at a thickness between about 4000 to 6000 Angstroms.

3. The MOSFET device structure of claim 1, wherein said metal pillar via structure is fabricated from: an underlying layer of titanium, at a thickness between about 300 to 500 Angstroms; a layer of titanium nitride, at a thickness between about 500 to 1000 Angstroms; and an overlying layer of tungsten, at a thickness between about 4000 to 6000 Angstroms.

4. The MOSFET device structure of claim 1, wherein said composite dielectric material, in spaces between said metal pillar via structures, is: an underlying, first PECVD silicon oxide layer, deposited to a thickness between about 2000 to 4000 Angstroms; a spin on glass layer, applied to a thickness between about 6000 to 10000 Angstroms; and an overlying, second PECVD silicon oxide layer, deposited to a thickness between about 6000 to 10000 Angstroms.

* * * * *